United States Patent
Liu et al.

(10) Patent No.: US 10,494,557 B2
(45) Date of Patent: Dec. 3, 2019

(54) METHOD OF PREPARING NITROGEN-DOPED GRAPHENE AND METHOD OF PRODUCING COMPOSITE HEAT DISPATCHING PLATE THEREOF

(71) Applicants: Chung Yuan Christian University, Taoyuan (TW); The-hydroxyl® Applied Carbon Technology, Inc., New Taipei (TW)

(72) Inventors: Wei Jen Liu, Taoyuan (TW); Zheng Zhe Xie, New Taipei (TW); Jun Shen, Yilan County (TW)

(73) Assignee: Chung Yuan Christian University, Taoyuan (TW)

( * ) Notice: Subject to any disclaimer, the term of this patent is extended or adjusted under 35 U.S.C. 154(b) by 0 days.

(21) Appl. No.: 15/168,097

(22) Filed: May 30, 2016

(65) Prior Publication Data
US 2016/0369149 A1    Dec. 22, 2016

(30) Foreign Application Priority Data
Jun. 22, 2015 (TW) .............................. 104120050 A

(51) Int. Cl.
 *C09K 5/14*  (2006.01)
 *C09D 7/62*  (2018.01)
(52) U.S. Cl.
 CPC . *C09K 5/14* (2013.01); *C09D 7/62* (2018.01)
(58) Field of Classification Search
 CPC ...................................................... C09K 5/14
 USPC ...................................................... 427/376.1
 See application file for complete search history.

(56) References Cited

FOREIGN PATENT DOCUMENTS

| CN | 101422725 B | * | 7/2010 | |
| CN | 103626158 | * | 3/2014 | ............ Y02E 60/13 |
| CN | 103626158 A | | 3/2014 | |
| CN | 103896254 A | | 7/2014 | |
| CN | 104600320 | * | 5/2015 | ............ H01M 4/661 |

OTHER PUBLICATIONS

Dong, Preparation of scale-like nickel cobaltite nanosheets assembled on nitrogen-doped reduced graphene oxide for high-performance supercapacitors, Carbon 80 (2014), p. 222-228.*
Yurong Liu, Carbon Materials for Supercapacitor Application.

* cited by examiner

*Primary Examiner* — Tabatha L Penny
(74) *Attorney, Agent, or Firm* — Raymond Chan

(57) ABSTRACT

The present invention relates to a method of preparing nitrogen-doped graphene, comprising: mixing at least one solid-state nitrogen containing precursor with a graphene to form a mixture, and sintering the mixture under a reducing atmosphere to obtain the nitrogen-doped graphene. The present invention further provides a method of producing a composite heat dispatching plate coated with nitrogen-doped graphene film, comprising: mixing a nitrogen-doped graphene obtained aforementioned with a polymer bonding agent to form a mixture slurry, coating the mixture slurry onto at least one surface of a metal substrate to form a composite material, drying the composite material, and obtaining the composite heat dispatching plate with a film of nitrogen-doped graphene. Structural defects of graphene lattices are reduced during doping process so that crystallinity and thermal conductivity are improved. Methods of the present invention may be conducted under normal pressure using commercially available solid-state nitrogen sources without adding polluting solvents to provide a safe, stable and cost effective preparation of composite heat dispatching material.

18 Claims, 4 Drawing Sheets

METHOD OF PREPARING NITROGEN-DOPED GRAPHENE AND METHOD OF PRODUCING COMPOSITE HEAT DISPATCHING PLATE THEREOF

CROSS REFERENCE OF RELATED APPLICATION

This Non-provisional application claims priority under 35 U.S.C. § 119(a) on Patent Application No. 104120050 filed in Taiwan on Jun. 22, 2015, the entire contents of which are hereby incorporated by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a method of preparing nitrogen-doped graphene and a method of producing a composite heat dispatching plate thereof, more particularly, to a method of preparing nitrogen-doped graphene using solid-state nitrogen containing precursor, and a method of producing a composite heat dispatching plate coated with nitrogen-doped graphene.

Description of Related Arts

The structure of graphene was determined and proven in 2004, and has since become the most promising and advantageous material in carbon related researches. Graphene is a layer of graphite with the stacked thickness of between one and ten carbon atoms, where carbon atoms are densely packed in two dimensional hexagonal patterns. Graphene has many extraordinary properties including great conductivities of heat and electricity, resistance to fire, high absorption rate to electromagnetic waves and it is nearly transparent.

Furthermore, the internal electrical and thermal conductivities of graphene can be adjusted by adding various elements. Conventionally, nitrogen-doped graphene is used to produce composite materials for electrical components, where liquid nitrogen sources or gas nitrogen sources are used during doping processes. However, a process using liquid nitrogen doping sources such as disclosed in Chinese patent CN103818895A and CN104229789A require additional solvents that may cause unnecessary pollutions, as well as complicate the preparation procedures. On the other hand, using gas nitrogen during doping processes requires more energy to allow nitrogen elements to effectively dope into graphene structures. Therefore, the present invention discloses a solid-state nitrogen doping process for graphene, where the solid-state nitrogen source may be obtained at reduced costs and also transported and stored easily. In addition, the present solid-state doping process may be conducted under normal pressure, hence effectively reduces levels of difficulty and danger during production. Additionally, the process can reduce pollutions to the environment greatly as well.

SUMMARY OF THE PRESENT INVENTION

The object of the present invention is to provide a method of preparing nitrogen-doped graphene (referred as "N-graphene" hereafter) and a method of producing a high thermal conductive composite heat dispatching plate that are suitable for continuous industrial productions. The composite heat dispatching plate may be composite heat dispatching materials such as N-graphene with copper foil, N-graphene with aluminum substrate or N-graphene with other relevant metal substrates. The present invention is to dope nitrogen into oxygen functional groups of graphene where the structural composition of graphene does not comprise of nitrogen (N). A graphene precursor may be expanded graphite, graphite intercalation compound, graphite, or the combinations thereof. Various types of solid-state nitrogen are then added and sintered under a high temperature and reducing atmosphere to obtain N-graphene. The solid-state nitrogen sources include organic and inorganic solid-state nitrogen sources, and nitrogen is doped into the structure of graphene during the doping process. Solid-state nitrogen does not only replace oxygen to carry out doping, but also improve the completeness of the lattices of graphene so that the crystallinity and thermal conductivity of graphene are bettered. Furthermore, the doping process may be conducted under normal pressure which prevents lattice defect caused by changes or breakage of the graphene crystal structure under a high pressure, and is applicable to various types of graphene. The present invention improves the structural completeness of carbon molecules in graphene in a simple and efficient manner. The organic or inorganic solid-state nitrogen sources may be easily obtained at low costs that are advantageous in effectively reducing overall manufacturing costs. Another object of the present invention is to repair structural defects in graphene by doping nitrogen with a simple solid-state preparation. Common industrial coating methods are utilized to coat N-graphene onto suitable metal substrates to form a high thermal conductive composite heat dispatching plates to meet requirements for industrial productions.

For above objects, the present invention provides the method of preparing N-graphene, comprising mixing at least one solid-state nitrogen-containing precursor with a graphene to form a mixture, and sintering the mixture under a reducing atmosphere to obtain the N-graphene. Once sintered, optional grinding may be applied to obtain N-graphene powder or other solid-state N-graphene.

The present invention further provides the method of producing a composite heat dispatching plate, comprising mixing the N-graphene obtained with previously mentioned method with a polymer bonding agent to form a mixture slurry, coating the mixture slurry onto at least one surface of a metal substrate to form a composite material, drying the composite material, and obtaining the composite heat dispatching plate with a film of N-graphene. The coating of the mixture slurry on the metal substrate may be applied on one side or both sides, and the thickness of the coating layer may be thin or thick.

In the present invention, the N-graphene has the following bonding configurations: Pyridinic $N(398.1 \sim 399.3$ eV) and Graphitic $N(401.1 \sim 402.7$ eV).

In the present invention, the composite heat dispatching plate coated with the N-graphene film may be attached to a base material using a double sided tape, wherein the base material may be composed of metal or plastic as a panel. The N-graphene film may be positioned towards a heat source, on either side of the metal substrate, facing or against the heat source. The composite heat dispatching plate may absorb and carry away heats generated by a heat source such as a CPU or a battery through thermal conductivity or thermal radiation, so that damages to electrical parts or reduced battery performance of an electronic product due to accumulated heats may be prevented. In addition, the method of preparing N-graphene according to the present invention may also use ready formulated or commercially available organic or inorganic solid-state nitrogen sources. Nitrogen is doped into graphene structures, the completeness of the graphene lattices is improved, and the crystallinity and thermal conductivity are bettered as a result. The graphene may be selected from at least one of monolayer graphene, multilayer graphene, graphene oxide, reduced graphene oxide and graphene derivatives.

The method of preparing N-graphene aforementioned, wherein the solid-state nitrogen containing precursor and the graphene may be mixed using solid phase mixing method to form the mixture.

The method of preparing N-graphene aforementioned, wherein the solid-state nitrogen containing precursor may be an organic solid-state nitrogen source, an inorganic solid-state nitrogen source, or the combination thereof. The organic solid-state nitrogen source may be selected from at least one of the following: $C_6H_{12}N_4$, $C_6H_5COONH_4$, $(NH_4)_2CO_3$, $HOC(CO_2NH_4)(CH_2CO_2NH_4)_2$, $HCO_2NH_4$, $C_{11}H_7N$, $C_3H_3N_6$, $C_{10}H_6(CN)_2$ and $C_{12}H_7NO_2$. The inorganic solid-state nitrogen source may be selected from at least one of $NH_4NO_3$ and other inorganic nitrate salts.

The method of preparing N-graphene aforementioned, wherein the graphene is preferably selected from at least one of monolayer graphene, multilayer graphene, graphene oxide, reduced graphene oxide and graphene derivatives.

The method of preparing N-graphene aforementioned, wherein the N-graphene preferably has bonding configurations of Pyridinic N (398.1~399.3 eV) and Graphitic N (401.1~402.7 eV).

The method of preparing N-graphene aforementioned, the total mass of the graphene and the solid-state nitrogen containing precursor being the comparing basis, wherein the mass mixing ratio between the solid-state nitrogen containing precursor and the graphene is preferably over 1 (one).

The method of preparing N-graphene aforementioned, wherein the mass mixing ratio between the graphene and the solid-state nitrogen containing precursor is preferably between 1:1 and 1:30.

The method of preparing N-graphene aforementioned, wherein the nitrogen content in the N-graphene is preferably 0.04 to 5 wt %.

The method of preparing N-graphene aforementioned, wherein the mixture is preferably sintered under the temperature between 300° C. and 800° C.

The method of preparing N-graphene aforementioned, the mixture is preferably sintered for 0.5 to 10 hours.

The method of producing the composite heat dispatching plate aforementioned, wherein the preferred polymer bonding agent is Carboxymethyl Cellulose (CMC).

The method of producing the composite heat dispatching plate aforementioned, wherein the mixture slurry may further include a conductive agent, an adhesive agent, or the combination thereof. The conductive agent may be, but not limited to: Timcal® KS-6 (electrical conductive graphite) and Super-P (electrical conductive carbon black). The adhesive agent may be, but not limited to: Styrene-Butadiene Rubber (SBR).

The method of producing the composite heat dispatching plate aforementioned, wherein the preferred N-graphene content in the mixture slurry is 50 to 90 wt %, even more preferred is 89 to 92 wt %.

The method of producing the composite heat dispatching plate aforementioned, wherein the preferred metal substrate is a copper foil.

The method of producing the composite heat dispatching plate aforementioned, wherein the preferred thickness of the N-graphene is between 15 and 65 µm.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE PREFERRED EMBODIMENT

The present invention is explained in relation to its embodiments and experimental samples. Any person of ordinary skills in the art shall understand methods disclosed in the present invention and appreciate advantages and benefits other than mentioned therein. It is to be understood that many other possible modifications and variations can be made without departing from the spirit and scope of the invention as hereinafter claimed.

The following description discloses a nitrogen-doped graphene (referred as "N-graphene" hereafter), a method of preparing the N-graphene, and embodiments of a testing device thereof. The description further discloses a composite heat dispatching plate coated with N-graphene and a method of producing thereof, as well as effects of various coating thicknesses, single or double sided coated, and facing direction of the film. It should be noted that drawings in the description are only schematic representatives of features of the present invention, and are not scaled to actual dimensions.

The present invention provides an N-graphene, including the following chemical bonding configurations: Pyridinic N (398.1~399.3 eV) and Graphitic N (401.1~402.7 eV), wherein solid-state nitrogen sources may be organic or inorganic nitrogen sources, the organic nitrogen sources include $C_6H_{12}N_4$(HMT), $C_6H_5COONH_4$, $(NH_4)_2CO_3$, $HOC(CO_2NH_4)(CH_2CO_2NH_4)_2$, $HCO_2NH_4$, $C_{11}H_7N$, $C_3H_3N_6$, $C_{10}H_6(CN)_2$ and $C_{12}H_7NO_2$, and the inorganic nitrogen sources include $NH_4NO_3$ and other inorganic nitrate salts.

The method of preparing N-graphene of the present invention may also utilize graphene obtained from mechanical exfoliation or oxidation reduction; and then mix the graphene with the organic or inorganic nitrogen sources, dope nitrogen into structures of graphene, improve completeness of graphene lattices, and better crystallinity and thermal conductivity of the graphene. The graphene may be selected from at least one of monolayer graphene, multilayer graphene, graphene oxide, reduced graphene and graphene derivatives.

Figure 1:
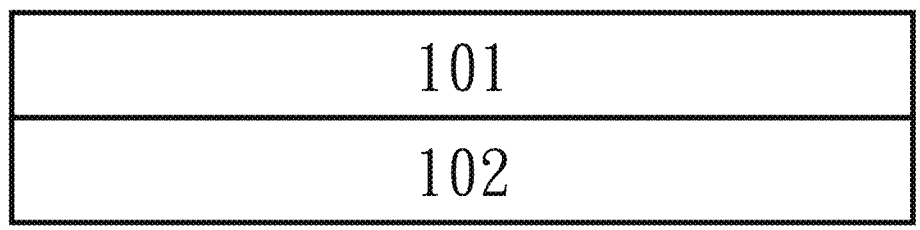
FIG. 1 is a schematic illustration of the structure of a composite heat dispatching plate of experimental samples 1 to 5, 7 to 9, 12 and embodiments 12 to 14 according to the present invention.
Figure 2:
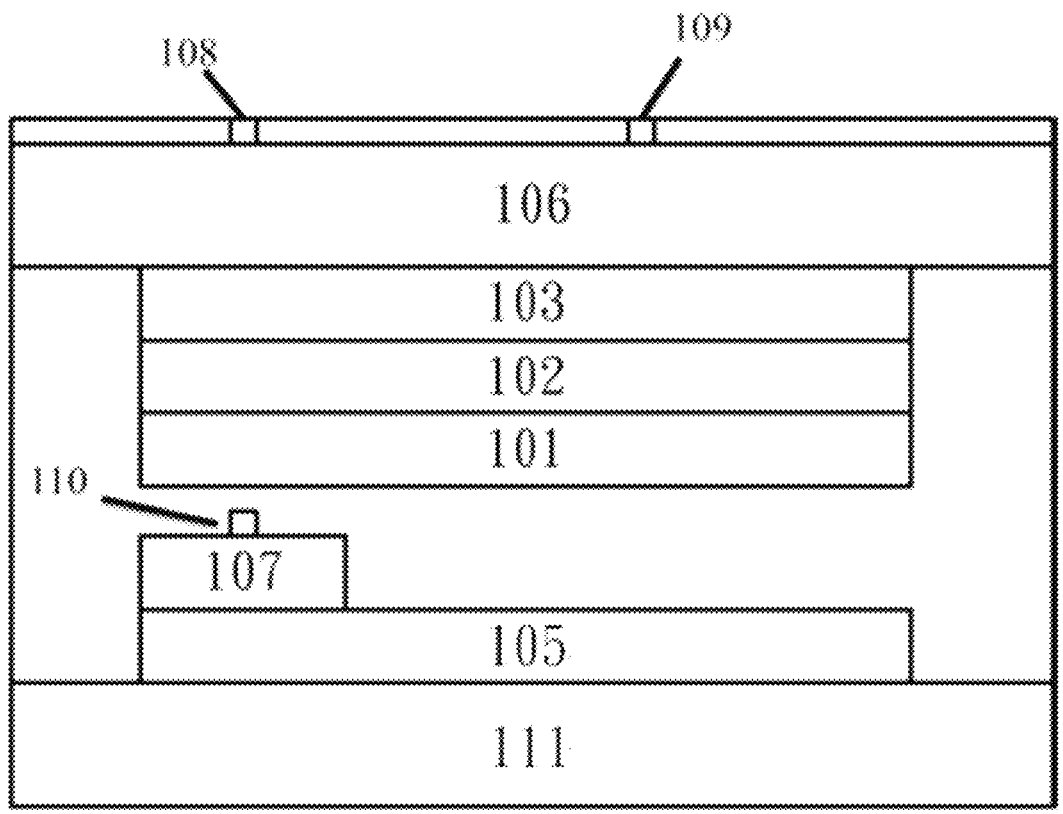
FIG. 2 is a schematic illustration of a testing device of the composite heat dispatching plate of experimental sample 1 to 5, 7 to 9, 12 and embodiments 12 to 14 according to the present invention.

With reference to FIGS. 1 and 2, schematic illustrations of the structure of the composite heat dispatching plate and the testing device thereof of experimental samples 1 to 5, 7 to 9, 12 and embodiments 12 to 14 of the present invention, the composite heat dispatching plate 100 comprises a copper foil 102 and a N-graphene film 101 coated on one of the surfaces of the copper foil 102. The present invention discloses a temperature testing method as following: applying a double sided tape 103 or other adhesive material on a surface of the copper foil 102 of the composite heat dispatching plate 100, attaching the composite heat dispatching plate 100 together with the double sided tape 103 on a base material 106, and then placing above in a testing device for temperature tests. The testing device may be regarded as a simulation of a tablet PC, wherein a heating chip 107 of one square centimeter (1×1 cm²) in size is attached to the copper plate 105 to simulate an operating CPU, and a tin foil 111 attached thereunder is to simulate other electrical parts of the tablet PC. This testing device has three sensing spots for temperature tests, namely a thermal spot 110 on the heating chip 107, a first testing spot 108 on the base material 106 on top of the heating chip 107, and a second testing spot 109 which is also on the base material 106 and 0.5 (zero point five) to 5 (five) centimeters apart from the first testing spot 108. This temperature testing method measures the gap between a temperature difference T1 (° C.) and another temperature difference T2 (° C.), wherein the temperature difference T1 is measured between the first testing spot 108 and the second testing spot 109 of the copper foil 102, and the temperature difference T2 is measured between the first testing spot 108 and the second testing spot 109 of the composite heat dispatching plate 100. In this embodiment, the horizontal distance between the first testing spot 108 and the second testing spot 109 is 0.5 (zero point five) centimeter, but not restricted thereto in other embodiments of the present invention. With reference to FIG. 2, the temperature on the thermal spot 110 is higher than the temperature on the first testing spot 108, and the temperature on the first testing spot 108 is higher than the temperature on the second testing spot 109. Heats are effectively directed away from the heating chip 107 when the composite heat dispatching plate 100 has a good heat dispatching performance, the temperature on the first testing spot 108 and the temperature on the second testing spot 109 are closer as a result. The temperature difference T2 between the first testing spot 108 and the second testing spot 109 of composite heat dispatching plate 100 is smaller, the temperature difference T1 between the first testing spot 108 and the second testing spot 109 of the copper foil 102 is larger, hence T1(° C.) is greater than T2(° C.). Therefore, a positive value of T1 minus T2 indicates a good heat dispatching performance of the composite heat dispatching plate 100, where the greater the value, the better the heat dispatching performance.

Figure 3A:
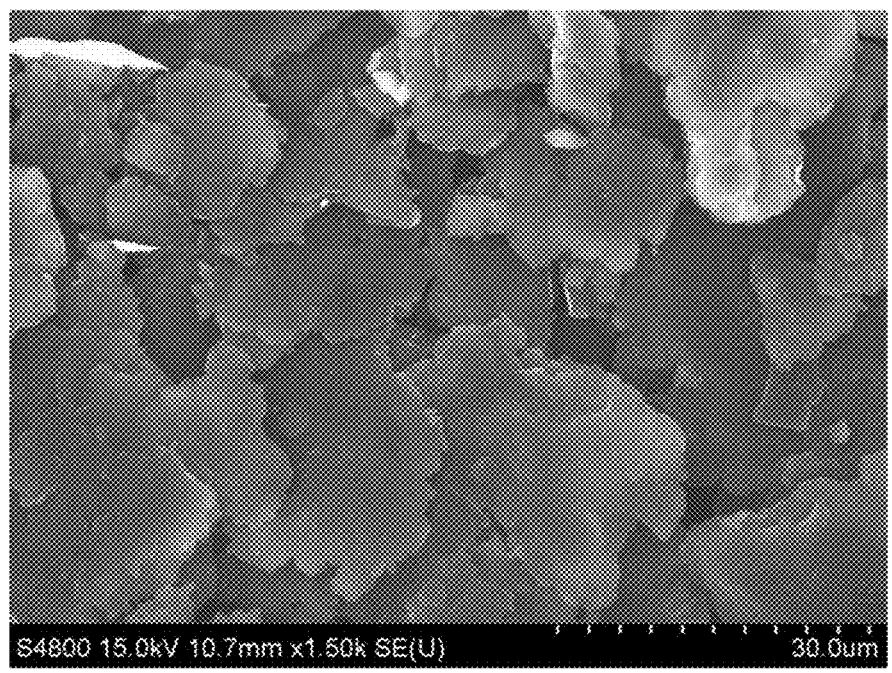
FIG. 3A is a scanning electron microscope (SEM) image of a graphene as a basis for comparison according to the present invention.

With reference to Table 1 below, 1 (one) gram of graphene is analyzed for its nitrogen, oxygen and carbon contents using X-ray photoelectron spectroscopy (XPS). The results as indicated in column 1 of Table 1 are used as a basis for comparison for content analysis of embodiments 1 to 7. In addition, scanning electron microscope (SEM) image of the graphene as another basis for comparison is shown in FIG. 3A. The graphene may be in a power form or other forms of solids, and not restricted thereto in the present invention.

Embodiment 1 of the present invention provides a structure of N-graphene and a preparing method thereof with the following steps: mixing 1 (one) gram of graphene and 1 (one) gram of solid-state Hexamethylenetetramine (HMT) ($C_6H_{12}N_4$) thoroughly to form a mixture, grinding and placing above mixture in a crucible (or thoroughly mixing without grinding, not restricted thereto in the present invention), placing the crucible in a high temperature sintering furnace to sinter under the temperature of 800° C. and a H2/N2 reducing atmosphere for 8 (eight) hours, and finally removing the crucible and obtaining N-graphene from the furnace. The N-graphene may be in the form of powder or any other forms of solids, and not restricted in the present invention.

With reference to Table 1, the N-graphene obtained in embodiment 1 is analyzed for nitrogen, oxygen and carbon contents using XPS, and the result is shown in column 2 of Table 1.

Figure 3B:
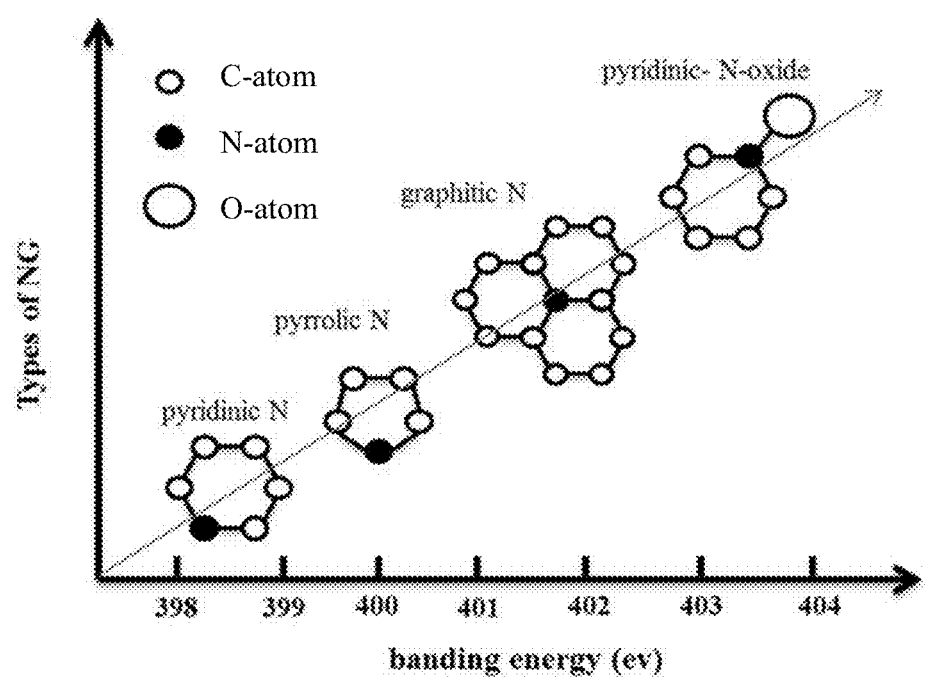
FIG. 3B is a X-ray Photoelectron spectroscopy (XPS) bond energy chart of the nitrogen-doped graphene according to the present invention.

Embodiments 2 to 7 of the present invention provide a structure of N-graphene and preparing methods thereof, wherein the steps, conditions and the type of solid-state nitrogen containing precursor are the same as embodiment 1. The differences in embodiment 2 to 7 are different masses of solid-state HMT are added. The mass ratios between graphene and solid-state EMT are 1:3, 1:5, 1:7, 1:10, 1:20 and 1:30 respectively. The nitrogen, oxygen and carbon contents in each of embodiment 2 to 7 are subsequently analyzed using XPS, and the results are as shown in Table 1 and bond energies thereof in FIGS. 3B and 3C.

Figures 3C, 4:
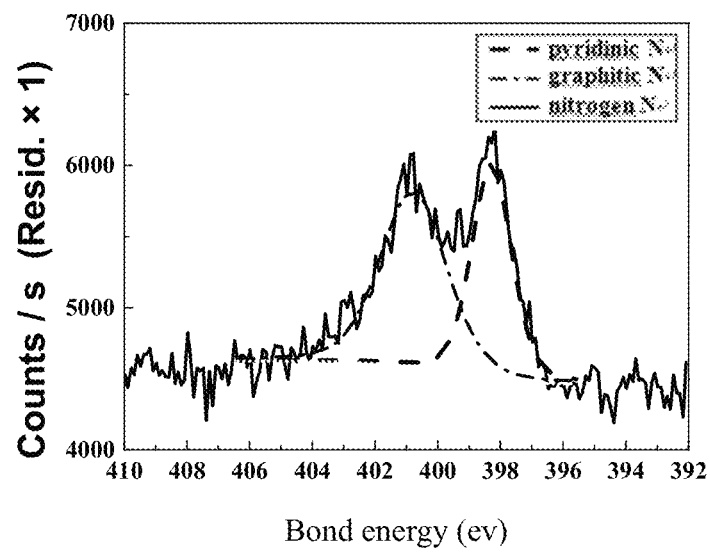
FIG. 3C is a XPS bond energy chart of the nitrogen-doped graphene of the embodiment 6 according to the present invention.
FIG. 4 is a schematic illustration of the structure of a composite heat dispatching plates of experimental samples 6, 10-11 and 13 of the present invention.

With reference to Table 1, embodiment 6 is a result of additional 20 wt % solid-state HMT to the basis for comparison, wherein the nitrogen content is 3.92% higher as compared to the basis. With further reference to FIG. 3C, which indicates the XPS bond energy chart of the N-graphene of embodiment 6, and the bonding configuration is known as Pyridinic N (398.1~399.3 eV) and Graphitic N (401.1~402.7 eV). In contrast to the bonding configuration consists of mainly C and O bonding in the basis for comparison, the bonding configuration of embodiment 6 have additional C and N bonding. Because C and N bonding reduces the structural defects in graphene lattices, embodiment 6 produces a result of better thermal conductivity, which translates to a better heat dispatching performance. Similarly, N-graphene of embodiments 1, 2 to 5 and 7 also achieve better heat dispatching performances. In the present invention, the nitrogen content in N-graphene is 0.04 to 5 wt %, the preferred nitrogen content is 2 to 5 wt %, and the more preferred nitrogen content is 4 wt %.

Embodiments 8 to 11 provide a structure of N-graphene and a preparing method thereof, wherein the steps and conditions of solid-state nitrogen containing precursor mixing ratio are the same as embodiment 1. The differences in embodiment 8 to 11 are different organic and/or inorganic solid-state nitrogen sources adding to them. The added organic and/or inorganic solid-state nitrogen sources are $(NH_4)_2CO_3$, $NH_4NO_3$, $NCO_2NH_4$ and $C_3H_3N_6$ respectively, as indicated in Table 2.

The nitrogen, oxygen and carbon contents of N-graphene of embodiments 8 to 11 are analyzed using XPS, and the results are shown as in Table 2.

TABLE 1

|  | graphene:HMT | C wt. % | O wt. % | N wt. % |
|---|---|---|---|---|
| Basis for comparison | 1:0 | 86.65 | 10.2 | 0 |
| Embodiment 1 | 1:1 | 80.78 | 12.19 | 3.27 |
| Embodiment 2 | 1:3 | 77.7 | 14.05 | 3.04 |
| Embodiment 3 | 1:5 | 78.81 | 14.32 | 2.41 |
| Embodiment 4 | 1:7 | 81.62 | 11.85 | 3.34 |
| Embodiment 5 | 1:10 | 82.37 | 10.51 | 4.61 |
| Embodiment 6 | 1:20 | 80.13 | 12.75 | 3.92 |
| Embodiment 7 | 1:30 | 82.63 | 11.9 | 3.53 |

TABLE 2

| Embodiment | Solid-state nitrogen source | C wt. % | O wt. % | N wt. % |
|---|---|---|---|---|
| 8 | $(NH_4)_2CO_3$ | 90.57 | 8.21 | 1.14 |
| 9 | $NH_4NO_3$ | 91.78 | 8.22 | 0.04 |
| 10 | $HCO_2NH_4$ | 92.37 | 6.25 | 1.3 |
| 11 | $C_3H_3N_6$ | 89.17 | 7.47 | 3.36 |

Experimental samples 1 to 13 provide a structure of composite heat dispatching plate coated with graphene that is not nitrogen doped. With reference to FIG. 1, the structure of experimental samples 1 to 13 is similar to that of embodiments 1 to 11, except the N-graphene film 101 is replaced by a graphene film not being nitrogen doped. With reference to FIG. 1 and Table 3, mixture slurry used for experiments is similar to that of aforementioned basis for comparison, with additional non-essential ingredients such as KS-6, Super-P, CMC, SBR . . . etc. The mixture slurry is used to experiment different heat dispatching performances with various graphene mass contents, mixture slurry coating thicknesses, and the copper foil 102 is coated on single side or double sides. Once the best performance condition is determined, heat dispatching performance of N-graphene will be further experimented. Because N-graphene has additional C and N bonding to reduce structural defects in graphene lattices, N-graphene performs better in heat dispatching as compared to graphene not being nitrogen doped. Methods of preparing experimental samples 1 to 13 are similar, except different proportions of graphene, polymer bonding agent (CMC), electrical conductive agent (KS-6, Super-P), and adhesive agent (SBR) are mixed. Respective mass mixing ratios between graphene and the whole mixture slurry are 50, 60, 70, 80, 89, 92 and 93 wt %. The amount of KS-6, Super-P, CMC and SBR added depending on the content of graphane is changed as shown in Table 3. To avoid repeated descriptions, only experimental sample 5 and Table 3 are discussed in details, and experimental samples 1 to 4 and 6 to 13 may be prepared accordingly.

Experimental sample 5 of the present invention provides a structure of a composite heat dispatching plate coated with graphene not being nitrogen doped, and a preparing method thereof, including following steps: preparing 1.5 g graphene, 0.1011 g CMC, 0.0506 g Super-P, 0.0337 g SBR, adding water as solvent and aforementioned ingredients orderly into a homogenizer mixer, mixing thoroughly to form a mixture slurry, applying the mixture slurry onto a copper foil 102, coating the mixture slurry onto the copper foil 102 using a coating applicator, placing the coated copper foil 102 into a high temperature furnace to remove water at the temperature 40° C. to 100° C. to obtain a composite material, measuring the thickness of the composite material, and pressing the composite material to 50 μm with appropriate pressing rate to obtain the composite heat dispatching plate 100 coated with the graphene film not being nitrogen doped 101.

With reference to FIG. 2, the composite heat dispatching plates 100 prepared in experimental samples 1 to 5, 7 to 9 and 12 have the graphene film not being nitrogen doped 101 coated on single side thereof, and a double sided tape 103 or other adhesive material is attached. The composite heat dispatching plate 100 coated with the graphene film not being nitrogen doped 101 and the double sided tape 103 are then attached to a base material 106, and then positioned in a testing device. A heating energy of 3 W is provided to a heating chip 107 to increase the temperature for measuring the gap between temperature difference T1 (° C.) and another temperature difference T2 (° C.), wherein the temperature difference T1 is measured between the first testing spot 108 and the second testing spot 109 of the copper foil 102, and the temperature difference T2 is measured between the first testing spot 108 and the second testing spot 109 of the composite heat dispatching plate 100 coated with the graphene film not being nitrogen doped 101. With reference to FIG. 4, the composite heat dispatching plates 200 prepared in experimental samples 6, 10, 11 and 13 have the graphene film not being nitrogen doped 101 coated on double sides thereof, which means the two opposite surfaces of the copper foil 102 are both coated with the graphene film not being nitrogen doped 101. Same experiments are conducted as shown in FIG. 2 for experimental samples 6, 10, 11 and 13, except the composite heat dispatching plate 100 is replaced with the composite heat dispatching plate 200 as shown in FIG. 4, and the results are as shown in Table 3.

Figure 5:
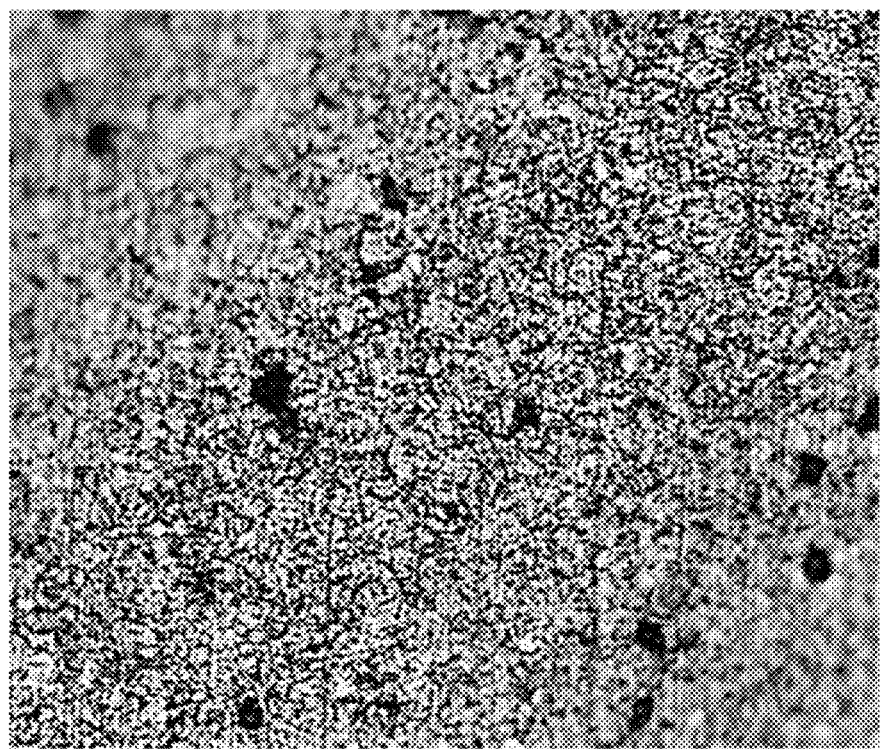
FIG. 5 is a microscope image of a copper foil coated with graphene not being nitrogen doped of experimental sample 5 of the present invention.

With reference to Table 3, experimental sample 5 is the result of additional 40 wt % to experimental sample 1. Comparing to experimental sample 1, the coating thickness is 10 μm thinner, but the heat dispatching performance is 1.27° C. higher. With further reference to FIG. 5, which is a microscope image of the copper foil 102 single side coated with the graphene film not being nitrogen doped 101 according to experimental sample 5 of the present invention. It is noted that the dispersion uniformity of graphene and other additives is higher when high graphene content is added, thus the heat dispatching performance is also higher as compared to when low graphene content is added.

Experimental samples 10 and 13 have the same graphene content of 60 wt %, the same proportions of KS-6, Super-P, CMC and SBR, and both have the graphene film not being nitrogen doped 101 coated on double sides. The only difference is coating thicknesses and the result is that the heat dispatching performance of experimental sample 13 is 0.7° C. higher than that of experimental 10. Therefore, a thicker graphene film not being nitrogen doped has higher graphene content and better heat dispatching performance as compared to a thinner graphene film not being nitrogen doped.

Experimental samples 12 and 13 have the same graphene content of 60 wt %, the same proportions of KS-6, Super-P, CMC and SBR, and both have the same thickness of the graphene film not being nitrogen doped 101. The only difference is the coating method where experimental sample 12 being single side coated with the graphene film not being nitrogen doped 101 and experimental sample 13 being double sides coated. The result is that the heat dispatching performance of experimental sample 13 is 0.8° C. higher than that of experimental 12. Therefore, a double sides coating allows one side of the graphene film not being nitrogen doped 101 to absorb heats, and another side of the graphene film not being nitrogen doped 101 to dispatch heats. Therefore, the double sides coating has better heat dispatching performance as compared to the single side coating.

embodiment 13 are 3 wt %, 6 wt % and 2 wt % respectively. Proportions of Super-P, CMC and SBR of embodiment 14 are 0 wt %, 8 wt % and 0 wt % respectively. Embodiments 13 and 14 are both single side coated with the thickness of 15 μm. Table 4 indicates different heat dispatching performances between different content proportions of N-graphene.

TABLE 3

| Experimental Sample | Graphene (wt.) % | KS-6 (wt.) % | Super-P (wt.) % | CMC (wt.) % | SBR (wt.) % | Single/ Double Side coating | Copper Foil/Coating thickness (μm) | T1-T2 (° C.) |
|---|---|---|---|---|---|---|---|---|
| 1 | 50 | 35 | 5 | 6 | 4 | Single | 35/25 | 0.03 |
| 2 | 60 | 25 | 5 | 6 | 4 | Single | 35/25 | 0.1 |
| 3 | 70 | 15 | 5 | 6 | 4 | Single | 35/25 | 0.3 |
| 4 | 80 | 5 | 5 | 6 | 4 | Single | 35/25 | 0.4 |
| 5 | 89 | — | 3 | 6 | 2 | Single | 35/15 | 1.3 |
| 6 | 89 | — | 3 | 6 | 2 | Double | 35/65 | 1.9 |
| 7 | 90 | — | — | 10 | — | Single | 35/25 | 0.3 |
| 8 | 92 | — | — | 8 | — | Single | 35/15 | 0.7 |
| 9 | 93 | — | — | 7 | — | Single | 35/15 | 0.34 |
| 10 | 60 | 25 | 5 | 6 | 4 | Double | 35/25 | 0.2 |
| 11 | 60 | 25 | 5 | 6 | 4 | Double | 35/25 | 0.6 |
| 12 | 60 | 25 | 5 | 6 | 4 | Single | 35/50 | 0.1 |
| 13 | 60 | 25 | 5 | 6 | 4 | Double | 35/50 | 0.9 |

Embodiment 12 of the present invention provides a structure and a method of preparing a composite heat dispatching plate coated with N-graphene, wherein the preparing steps and conditions are similar to experimental sample 5, except embodiment 12 uses the same N-graphene obtained in embodiment 6. The N-graphene content is 89 wt % and the proportions of KS-6, Super-P, CMC and SBR, coating thickness, and coating method are the same. Table 4 indicates differences in heat dispatching performances between N-graphene and graphene not being nitrogen doped.

With reference to FIG. 2, the composite heat dispatching plate 100 coated with N-graphene film 101 is attached with a double sided tape 103 or other adhesive material, attached to the base material 106, and then positioned in a testing device. A heating energy of 3 W is provided to a heating chip 107 to increase the temperature for measuring the gap between temperature difference T1 (° C.) and another temperature difference T2 (° C.), wherein the temperature difference T1 is measured between the first testing spot 108 and the second testing spot 109 of the copper foil 102, and the temperature difference T2 is measured between the first testing spot 108 and the second testing spot 109 of the composite heat dispatching plate 100 coated with N-graphene film 101. Table 4 indicates the results where the single side coating with the graphene film not being nitrogen doped of experimental sample 5 is replaced by the single side coating with N-graphene film of embodiment 12. The heat dispatching performance of embodiment 12 is 1.4° C. higher that of experimental sample 5. Therefore, the N-graphene film has better heat dispatching performance than the graphene film not being nitrogen doped.

Embodiments 13 and 14 of the present invention provide a structure and a method of preparing a composite heat dispatching plate coated with N-graphene, wherein the preparing steps and conditions are similar to experimental sample 5, except embodiments 13 and 14 use the same N-graphene obtained in embodiment 6. The N-graphene contents of embodiments 13 and 14 are 89 wt % and 92 wt % respectively. Proportions of Super-P, CMC and SBR of With reference to FIG. 2, the composite heat dispatching plate 100 coated with N-graphene film 101 is attached with a double sided tape 103 or other adhesive material, attached to the base material 106, and positioned in the testing device. A heating energy of 3 W is provided to a heating chip 107 to increase the temperature by 15° C. for measuring the gap between temperature difference T1 (° C.) and another temperature difference T2 (° C.), wherein the temperature difference T1 is measured between the first testing spot 108 and the second testing spot 109 of the copper foil 102, and the temperature difference T2 is measured between the first testing spot 108 and the second testing spot 109 of the composite heat dispatching plate 100 coated with N-graphene film 101. Table 4 indicates the results where the heat dispatching performance of embodiment 13 is 0.2° C. higher than embodiment 14. The reason being the added Super-P assists in filling gaps formed during stacking process of N-graphene. Therefore, N-graphene with added Super-P has better heat dispatching performance than that of without Super-P.

It is further noted in results of experimental sample 5 and embodiments 12 to 14 in Table 4, the heat dispatching performances drop when the temperature of the heating chip 107 reaches 90° C. The reason being the high temperature causes N-graphene molecules to vibrate at a higher frequency, hence the contacting surface between the coated N-graphene film 101 and the copper foil 102 is reduced and causing the dropping heat dispatching performance. Even the heating chip 107 is heated to 90° C. as shown in embodiments 13-14, the temperature testing method of T1-T2 (° C.) in the present invention is positive, which is still better than the copper foil 102 using alone and can effectively enhance the ability of heat dispatching performance about 0.2-0.4° C.

TABLE 4

| | N-graphene film | Graphene or N-graphene film (wt.) % | Heating Chip Temperature (° C.) | Super-P (wt.) % | CMC (wt.) % | SBR (wt.) % | Single/ Double side coating | Copper Foil/Coating thickness (μm) | T1-T2 (° C.) |
|---|---|---|---|---|---|---|---|---|---|
| Experimental Sample 5 | No | 89 | 75 | 3 | 6 | 2 | Single | 35/15 | 1.3 |
| Embodiment 12 | Yes | 89 | 75 | 3 | 6 | 2 | Single | 35/15 | 2.7 |
| Embodiment 13 | Yes | 89 | 90 | 3 | 6 | 2 | Single | 35/15 | 0.4 |
| Embodiment 14 | Yes | 92 | 90 | — | 8 | — | Single | 35/15 | 0.2 |

Figure 6:
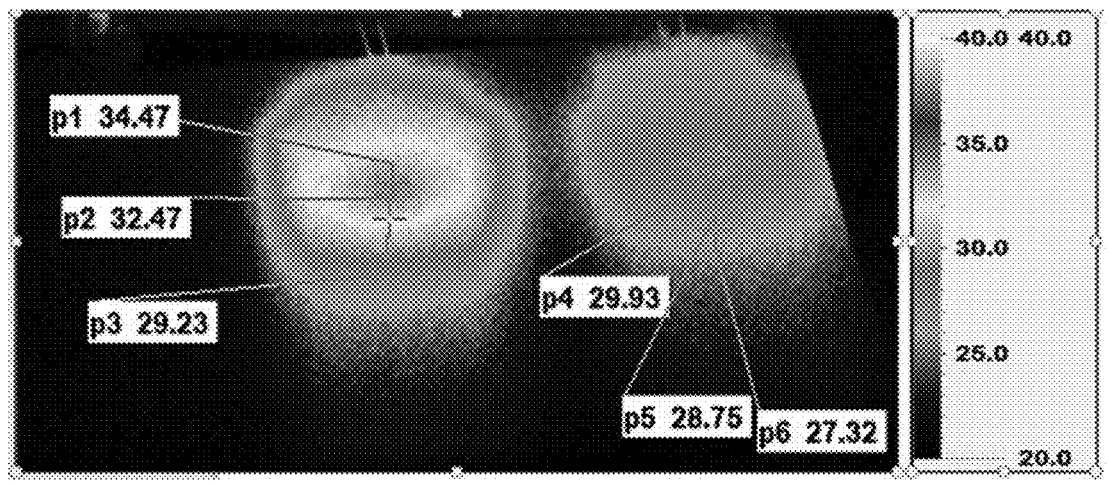
FIG. 6 is a temperature distribution chart (thermograms) on the overall observation on the composite heat dispatching plate coated with nitrogen-doped graphene (left) and copper foil (right) of embodiment 12 of the present invention.

With reference to FIG. 6, a structure of a composite heat dispatching plate coated with N-graphene film and a testing method thereof are disclosed. FIG. 6 is an overall observation on temperature distribution changes in zones. The same testing device as shown in FIG. 2 is used and a heating energy of 3 W is provided to the heating chip 107. After heating for 5 (five) minutes, temperature distribution changes in zones are observed using a thermal imaging camera. P1 and P4 are the sensing spots on top of the heating chip 107. P2 and P3 are sensing spots that are one and two centimeters extended from P1 respectively. P5 and P6 are one and two centimeters extended from P4 respectively. A higher temperature indicates that heats are more effectively carried away from the heat source horizontally and vertically. The image on the left and the image on the right of FIG. 6 are comparisons of heat dispatching performances between the composite heat dispatching plate 100 coated with N-graphene film 101 and the copper foil 102 obtained in embodiment 12.

The observation results of the thermal imaging camera show that the composite heat dispatching plate 100 coated with N-graphene film 101 increases heat radiation absorption and thermal conduction efficiency. With reference to FIG. 6, after heating for 5 (five) minutes, temperatures of P1, P2 and P3 of the composite heat dispatching plate 100 coated with N-graphene film 101 are higher than temperatures of P4, P5 and P6 of the copper foil 102. Therefore, the composite heat dispatching plate 100 coated with N-graphene film 101 of the present invention have improved heat radiation absorption and thermal conduction efficiency vertically (temperature of P1 is higher than P4) and horizontally (temperature of P3 is higher than P6), and have a better heat dispatching performance as compared to the copper foil 102 of the image on the right.

What is claimed is:

1. A method of preparing nitrogen-doped graphene for a heat dispatching plate, comprising the steps of:
   mixing at least one solid-state precursor containing nitrogen with a solid-state graphene to directly form a powder mixture by using a solid phase mixing method; and
   sintering said powder mixture under a reducing atmosphere to obtain said nitrogen-doped graphene, wherein said solid-state precursor containing nitrogen is an organic solid-state nitrogen source, and said organic solid-state nitrogen source is selected from at least one of the following: $C_6H_5COONH_4$, $HOC(CO_2NH_4)(CH_2CO_2NH_4)_2$, $HCO_2NH_4$, $C_{11}H_7N$, $C_{10}H_6(CN)_2$ and $C_{12}H_7NO_2$.

2. The method of preparing nitrogen-doped graphene according to claim 1, wherein said solid-state precursor containing nitrogen is a combination of an organic solid-state nitrogen source and an inorganic solid-state nitrogen source; said organic solid-state nitrogen source is selected from at least one of the following: $C_6H_{12}N_4$, $C_6H_5COONH_4$, $(NH_4)_2CO_3$, $HOC(CO_2NH_4)(CH_2CO_2NH_4)_2$, $HCO_2NH_4$, $C_{11}H_7N$, $C_3H_3N_6$, $C_{10}H_6(CN)_2$ and $C_{12}H_7NO_2$; and said inorganic solid-state nitrogen source is selected from at least one of $NH_4NO_3$ and other inorganic nitrate salts.

3. The method of preparing nitrogen-doped graphene according to claim 1, wherein said solid-state graphene is selected from at least one of monolayer graphene, multilayer graphene, reduced graphene oxide and graphene derivatives.

4. The method of preparing nitrogen-doped graphene according to claim 1, wherein said nitrogen-doped graphene has bonding configurations of Pyridinic N(398.1~399.3 eV) and Graphitic N(401.1~402.7 eV).

5. The method of preparing nitrogen-doped graphene according to claim 1, wherein a mass mixing ratio between said solid-state precursor containing nitrogen and said solid-state graphene is over 1.

6. The method of preparing nitrogen-doped graphene according to claim 1, wherein a mass mixing ratio between said solid-state graphene and said solid-state precursor containing nitrogen is between 1:1 and 1:30.

7. The method of preparing nitrogen-doped graphene according to claim 1, wherein a nitrogen content of said nitrogen-doped graphene is between 0.04 wt % and 5 wt %.

8. The method of preparing nitrogen-doped graphene according to claim 1, wherein said powder mixture is sintered under a temperature between 300° C. and 800° C.

9. The method of preparing nitrogen-doped graphene according to claim 1, wherein said powder mixture is sintered for 0.5 to 10 hours.

10. A method of producing a composite heat dispatching plate, comprising the steps of:
    mixing a nitrogen-doped graphene with a polymer bonding agent to form a mixture slurry, wherein said nitrogen-doped graphene is prepared by using any of the methods of claims 1, 3 to 9, wherein said nitrogen-doped graphene content in said mixture slurry is between 50 wt % and 93 wt %;
    coating said mixture slurry onto at least one surface of a metal substrate to form a composite material;
    drying said composite material; and
    obtaining said composite heat dispatching plate with a coating of nitrogen-doped graphene.

11. The method of producing a composite heat dispatching plate according to claim 10, wherein said polymer bonding agent is Carboxymethyl Cellulose.

12. The method of producing a composite heat dispatching plate according to claim 10, wherein said mixture slurry further comprising an electricity conductive agent, an adhesive agent, or a combination thereof.

13. The method of producing a composite heat dispatching plate according to claim 10, wherein said nitrogen-doped graphene content in said mixture slurry is between 89 wt % and 92 wt %.

14. The method of producing a composite heat dispatching plate according to claim 13, wherein said mixture slurry further comprises 8 wt % to 11 wt % of conductive graphite, Carboxymethyl cellulose and butadiene styrene rubber.

15. The method of producing a composite heat dispatching plate according to claim 10, wherein said metal substrate is a copper foil.

16. The method of producing a composite heat dispatching plate according to claim 10, wherein a thickness of said nitrogen doped graphene coating is between 15 um and 65 um.

17. The method of producing a composite heat dispatching plate according to claim 10, wherein said mixture slurry further comprises 7 wt % to 50 wt % of conductive graphite, Carboxymethyl Cellulose and butadiene styrene rubber.

18. A method of preparing nitrogen-doped graphene for a heat dispatching plate, comprising:
mixing at least one solid-state precursor containing nitrogen with a solid-state graphene to directly form a powder mixture; and
sintering said powder mixture under a reducing atmosphere to obtain said nitrogen-doped graphene, wherein said solid-state precursor containing nitrogen is an organic solid-state nitrogen source, and said organic solid-state nitrogen source is selected from at least one of the following: $C_6H_5COONH_4$, $HOC(CO_2NH_4)(CH_2CO_2NH_4)_2$, $HCO_2NH_4$, $C_{11}H_7N$, $C_{10}H_6(CN)_2$ and $C_{12}H_7NO_2$.

* * * * *